(12) United States Patent
Lee et al.

(10) Patent No.: US 9,299,937 B2
(45) Date of Patent: Mar. 29, 2016

(54) ACTIVE LAYER, ORGANIC PHOTOVOLTAIC CELL COMPRISING THE SAME AND MANUFACTURING METHOD THEREOF

(71) Applicant: LG CHEM, LTD., Seoul (KR)

(72) Inventors: Hangken Lee, Daejeon (KR); Ji Hye Jeon, Seoul (KR); Jaechol Lee, Daejeon (KR); Dong Hwan Wang, Seoul (KR); Jong Hyeok Park, Suwon-si (KR); O Ok Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 143 days.

(21) Appl. No.: 14/039,638

(22) Filed: Sep. 27, 2013

(65) Prior Publication Data

US 2014/0116511 A1 May 1, 2014

Related U.S. Application Data

(63) Continuation-in-part of application No. PCT/KR2012/007932, filed on Sep. 28, 2012.

(51) Int. Cl.
*H01L 31/044* (2014.01)
*H01L 51/00* (2006.01)
*B82Y 10/00* (2011.01)
*H01L 31/0256* (2006.01)
*H01L 51/42* (2006.01)

(52) U.S. Cl.
CPC ............ *H01L 51/0071* (2013.01); *B82Y 10/00* (2013.01); *H01L 51/0026* (2013.01); *H01L 51/0032* (2013.01); *H01L 51/0062* (2013.01); *H01L 51/0069* (2013.01); *H01L 51/0036* (2013.01); *H01L 51/0046* (2013.01); *H01L 51/4253* (2013.01); *H01L 2031/0344* (2013.01); *Y02E 10/549* (2013.01); *Y02P 70/521* (2015.11)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| 6,344,285 B1 | 2/2002 | Kwon et al. |
|---|---|---|
| 2010/0200841 A1 | 8/2010 | Cheon et al. |

(Continued)

FOREIGN PATENT DOCUMENTS

| JP | 2011-168747 A | 9/2011 |
|---|---|---|
| JP | 2011-204739 A | 10/2011 |

(Continued)

OTHER PUBLICATIONS

"The role of non-solvent swelling in bulk hetero junction solar cells," Ji Hye Jeon et al. Solar Energy Materials & Solar Cells, vol. 102, pp. 196-200 (2012).

(Continued)

*Primary Examiner* — Bach Dinh
(74) *Attorney, Agent, or Firm* — Dentons US LLP

(57) ABSTRACT

The present specification provides a photoactive layer including an electron accepting material and an electron donating material, an organic photovoltaic cell including the same, and a method of manufacturing the organic photovoltaic cell, which includes treating the electron accepting material and the electron donating material by a non-solvent.

16 Claims, 7 Drawing Sheets

(56) References Cited

U.S. PATENT DOCUMENTS

2011/0272029 A1   11/2011   Ihn et al.
2011/0297216 A1*  12/2011   Ihn .................. H01L 51/441
                                                       136/255
2011/0315225 A1   12/2011   Choi

FOREIGN PATENT DOCUMENTS

| KR | 10-2011-0098302 A | 9/2011 |
| KR | 2011-01333717 A | 12/2011 |
| KR | 2012-0000409 A | 1/2012 |
| KR | 2012-0000522 A | 1/2012 |
| KR | 2012-0047682 A | 5/2012 |
| WO | 2010-110164 A1 | 9/2010 |

OTHER PUBLICATIONS

Jeon, Ji Hye et al., "The role of non-solvent swelling in bulk hetero junction solar cells", Solar Energy Materials & Solar Cells, vol. 102, 2012, pp. 196-200.

* cited by examiner

ACTIVE LAYER, ORGANIC PHOTOVOLTAIC CELL COMPRISING THE SAME AND MANUFACTURING METHOD THEREOF

This application claims the benefit of, and is a continuation-in-part of International Application No. PCT/KR2012/007932, filed Sep. 28, 2012, which is incorporated by reference herein.

TECHNICAL FIELD

The present specification relates to a photoactive layer, an organic photovoltaic cell using the same, and a method of manufacturing the same.

BACKGROUND ART

In 1992, since Heeger of UCSB initially exhibited a possibility of a photovoltaic cell using an organic polymer, many studies thereof have been presently conducted. The cell is a heterojunction thin film diode in which an organic polymer absorbing light and a C60 fullerene derivative or a C70 fullerene derivative having very high electrophilicity are mixed with each other, and adopts ITO (indium tin oxide) that is a transparent electrode as an anode and a metal electrode having a low work function, such as Al, as a cathode material.

Light is absorbed in a photoactive layer constituted by the organic polymer to form an electron-hole pair (or exciton). There is a technology in which after the electron-hole pair moves to an interface between the copolymer and the C60 fullerene derivative or C70 fullerene derivative to be separated into electrons and holes, the electrons move to the metal electrode and the holes move to the transparent electrode, thereby generating the electrons.

Currently, efficiency of the organic polymer thin film photovoltaic cell using the organic polymer comes to 7 to 8% (Nature Photonics, 2009, 3, 649-653).

However, currently, efficiency of the organic polymer photovoltaic cell has a low level as compared to maximum efficiency (~39%) of the photovoltaic cell using silicone. There is a demand for developing the organic photovoltaic cell having higher efficiency.

PRIOR ART DOCUMENT

Non-Patent Document

Nature Photonics, 2009, 3, 649-653

DETAILED DESCRIPTION OF THE INVENTION

Technical Problem

The present specification has been made in an effort to provide an organic photovoltaic cell having improved efficiency and a method of manufacturing the same, and a photoactive layer used in the organic photovoltaic cell.

Technical Solution

An exemplary embodiment of the present invention provides an organic photovoltaic cell including: a first electrode; a second electrode facing the first electrode; and an organic layer provided between the first electrode and the second electrode and including a photoactive layer, in which the photoactive layer includes an electron accepting material and an electron donating material, and the electron accepting material and the electron donating material are treated by a non-solvent.

Another exemplary embodiment of the present invention provides an organic photovoltaic cell including: a first electrode; a second electrode facing the first electrode; and an organic layer provided between the first electrode and the second electrode and including a photoactive layer, in which the photoactive layer includes an electron accepting material and an electron donating material, and a ratio ($I_{c=c}/I_{c-c}$) of an antisymmetric value and a symmetric value of an absorption spectrum of FT-IR is increased by 110 to 150% as compared to an intrinsic value of the electron accepting material and the electron donating material.

Another exemplary embodiment of the present invention provides an organic photovoltaic cell including: a first electrode; a second electrode facing the first electrode; and an organic layer provided between the first electrode and the second electrode and including a photoactive layer, in which the photoactive layer includes an electron accepting material and an electron donating material, the electron accepting material and the electron donating material are treated by a non-solvent, and efficiency of the organic photovoltaic cell is increased by 110 to 200% as compared to the case where the photoactive layer includes the electron accepting material and the electron donating material before being treated by the non-solvent.

Another exemplary embodiment of the present invention provides a photoactive layer including: an electron accepting material, and an electron donating material, in which the electron accepting material and the electron donating material are treated by a non-solvent.

Another exemplary embodiment of the present invention provides a photoactive layer including: an electron accepting material, and an electron donating material, in which a ratio ($I_{c=c}/I_{c-c}$) of an antisymmetric value and a symmetric value of an absorption spectrum of FT-IR is increased by 110 to 150% as compared to an intrinsic value of the electron accepting material and the electron donating material.

Another exemplary embodiment of the present invention provides a method of manufacturing an organic photovoltaic cell, including: preparing a substrate; forming a first electrode in one region of the substrate; forming an organic layer including a photoactive layer on an upper portion of the first electrode; treating the photoactive layer by a non-solvent; and forming a second electrode on the organic layer.

Advantageous Effects

According to an exemplary embodiment of the present specification, it is possible to manufacture a photoactive layer through a simple process of treatment by a non-solvent and, if necessary, heat treatment. Further, the photoactive layer that is subjected to the aforementioned treatment has high conductivity and is stable.

The photoactive layer according to the exemplary embodiment of the present specification has good light absorptivity, and has a stabilized molecular structure through self organization of an electron accepting material and an electron donating material. Accordingly, an organic photovoltaic cell including the photoactive layer according to the exemplary embodiment of the present specification can exhibit excellent characteristics such as an increase in open voltage and an increase in efficiency.

Particularly, the photoactive layer according to the exemplary embodiment of the present specification has high light absorptivity, high charge mobility because a conjugation length is lengthened, low resistance to an electrode, and an improved morphology, thus improving a life-span characteristic and efficiency of a diode.

BEST MODE

Figure 1:
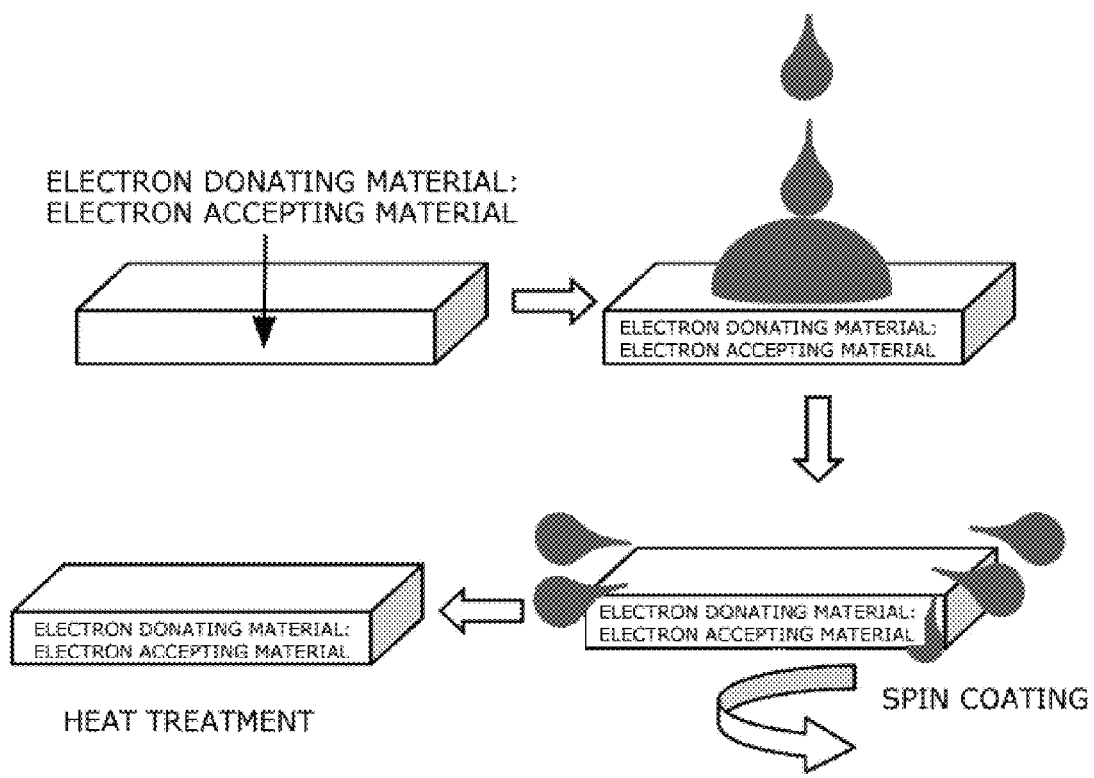
FIG. 1 is a view illustrating a method of manufacturing a photoactive layer according to an exemplary embodiment of the present specification.

Hereinafter, the present specification will be described in detail.

The present specification provides an organic photovoltaic cell including a first electrode; a second electrode facing the first electrode; and an organic layer provided between the first electrode and the second electrode and including a photoactive layer, in which the photoactive layer includes an electron accepting material and an electron donating material, and the electron accepting material and the electron donating material are treated by a non-solvent.

In the present specification, the non-solvent means a matter in which the electron donating material or the electron accepting material is not dissolved or not reacted.

In the present specification, the "treatment by non-solvent" means "swelling treatment by non-solvent" that when the non-solvent is applied on electron donating materials or electron accepting materials, the non-solvent permeates the electron donating material or the electron accepting material, and thus a swelling phenomenon occurs, or "surface treatment by non-solvent" that the non-solvent acts on a surface of the electron donating material or the electron accepting material according to removing the non-solvent after the non-solvent is applied on the electron donating material or the electron accepting material.

In the present specification, "acting" means affecting the surface of the electron donating material or the electron accepting material by forming dipole on their surface and/or changing of their chemical structure and/or the like.

Further, in the exemplary embodiment of the present specification, when the non-solvent is applied on the photoactive layer, a swelling phenomenon occurs, and thus the non-solvent permeates the photoactive layer.

In the exemplary embodiment of the present specification, a permeation distance of the non-solvent into the photoactive layer is 5% or more and less than 50% of the thickness of the photoactive layer. In another exemplary embodiment, the permeation distance of the non-solvent into the photoactive layer is 5 to 30% of the thickness of the photoactive layer.

When the non-solvent is applied on the photoactive layer, a kind, a treating method, and an amount of the non-solvent may be selected.

When the non-solvent is applied on the photoactive layer for 1 min to 60 min, the permeation distance of the non-solvent into the photoactive layer is 5% or more and less than 50% of the thickness of the photoactive layer.

In the case where the permeation distance of the non-solvent into the photoactive layer is 50% or more of the thickness of the photoactive layer, the photoactive layer may be separated from the coated substrate.

Further, in the case where the permeation distance of the non-solvent into the photoactive layer is 5 to 30% of the thickness of the photoactive layer, an interfacial area between the photoactive layer and the electrode may be increased and a contact characteristic thereof may be improved to improve performance of the diode.

In the present specification, a non-solvent swelling method includes a method of applying a non-solvent on an upper portion of a photoactive layer and performing spin coating or drop coating.

In the present specification, a non-solvent surface treating method includes a method of removing the non-solvent by spin coating after applying a non-solvent on an upper portion of a photoactive layer.

If the non-solvent swelling method is applied to the photoactive layer, the photoactive layer and the interface between the photoactive layer and the electrode can be simultaneously adjusted, which is useful to improve morphology of the photoactive layer. Further, a manufacturing process is relatively simple spin coating or the like, which has temporal and economical advantages of the process.

The applied non-solvent permeates a space of the photoactive layer to increase a space between polymer chains, thus increasing movement of the polymer chains. Further, if movement of the polymer chains is increased, the arranged molecular structure is formed through self organization of the molecular structure. In this case, a conjugation length is increased to increase charge mobility and an optical characteristic, thus providing high light absorptivity, thereby contributing to an increase in efficiency.

In the exemplary embodiment, the non-solvent is applied for 1 min or more by the non-solvent swelling method. In another exemplary embodiment, the non-solvent is applied for 1 min to 60 min.

In another exemplary embodiment, the non-solvent is applied for 10 min to 40 min.

In another exemplary embodiment, the non solvent is removed within 1 min after the non solvent is applied. In the case, the applied non-solvent is more efficient for a non-solvent surface treatment of the photoactive layer rather than permeation of a non-solvent into the photoactive layer.

In the case where the non-solvent is applied for 1 min or more, the permeation distance of the non-solvent into the photoactive layer may be increased. When the application is performed within 60 min, the permeation distance of the non-solvent into the photoactive layer may be set to be more than 50% of the thickness of the photoactive layer to prevent progressing of a stripping phenomenon.

In another exemplary embodiment of the present specification, if necessary time of applying a non-solvent may be controlled to do swelling treatment by a non-solvent, to do surface treatment by a non-solvent, or to do simultaneously with swelling treatment by a non-solvent and surface treatment by a non-solvent.

In the exemplary embodiment of the present specification, there is provided an organic photovoltaic cell where the electron accepting material and the electron donating material are heat treated before, during, or after being swollen by the non-solvent.

In the exemplary embodiment, the electron accepting material and the electron donating material may be heat treated before being swollen by the non-solvent.

In the exemplary embodiment, the electron accepting material and the electron donating material may be heat treated after being swollen by the non-solvent.

In the exemplary embodiment, the electron accepting material and the electron donating material may be heat treated while being swollen by the non-solvent. In this case, the permeation distance of the non-solvent into the photoactive layer is increased due to heat applied when being swollen by the non-solvent to reduce a treating time of the non-solvent and simplify the process without subsequent heat treatment or a course of removing the non-solvent by spin coating or blowing, and thus, there are merits in terms of time and/or cost.

The non-solvent is one or two or more selected from the group consisting of water, alkanes, halohydrocarbons, ethers, ketones, esters, nitrogen compounds, sulfur compounds, acids, alcohols, phenols, and polyols.

In the exemplary embodiment of the present specification, the alkane-based non-solvent is one or two or more selected from the group consisting of n-butane, n-pentane, n-hexane, n-octane, isooctane, n-dodecane, dichloromethane, cyclohexane, and methylcyclohexane.

In the exemplary embodiment of the present specification, the alkane-based non-solvent is dichloromethane.

The electron donating material, for example, P3HT is not dissolved in the alkane-based non-solvent, but the electron accepting material, for example, PCBM has selective solubility. In this case, in the case where the non-solvent is used alone or while being mixed with another solvent in a predetermined amount, the electron accepting material is selectively dissolved on the surface while being swollen to increase the interfacial bonding area.

In the exemplary embodiment, the halohydrocarbon-based non-solvent is one or two or more selected from the group consisting of chloromethane, dichloromethane, methylene chloride, 1,1-dichloroethylene, ethylenedichloride, chloroform, 1,1-dichloroethane, trichloroethylene, carbon tetrachloride, chlorobenzene, o-dichlorobenzene, and 1,1,2-trichlorotrifluoranthene.

In another exemplary embodiment, the ether-based non-solvent is one or two or more selected from the group consisting of tetrahydrofuran, 1,4-dioxane, diethylether, and dibenzylether.

In the case where the ether-based non-solvent is used, since a boiling point is low, it is easy to remove the solvent after the non-solvent swelling method, and thus, the process is simple and there are merits in terms of time and cost.

In another exemplary embodiment, the ketone-based non-solvent is one or two or more selected from the group consisting of acetone, methylethylketone, cyclohexanone, diethylketone, acetophenone, methylisobutylketone, methylisoamylketone, isophorone, and di(isobutyl)ketone.

In the exemplary embodiment, the ester-based non-solvent is one or two or more selected from the group consisting of ethylene carbonate, methyl acetate, ethyl formate, propylene-1,2-carbonate, ethyl acetate, diethyl carbonate, diethyl sulfate, n-butyl acetate, isobutyl acetate, 2-ethoxyethyl acetate, isoamyl acetate, and isobutyl isobutyrate.

In the present specification, the nitrogen compound means a solvent in which the electron donating material or the electron accepting material is not dissolved or not reacted among the compounds including nitrogen.

In another exemplary embodiment, the nitrogen compound non-solvent is one or two or more selected from the group consisting of acetonitrile, propionitrile, nitromethane, nitroethane, 2-nitropropane, nitrobenzene, ethanolamine, ethylene diem me, pyridine, morpholine, aniline, N-methyl-2-pyrrolidone, cyclohexylamine, quinoline, formamide, and N,N-dimethylformamide.

In the present specification, the sulfur compound means a solvent in which the electron donating material or the electron accepting material is not dissolved or not reacted among the compounds including sulfur.

In another exemplary embodiment, the sulfur compound non-solvent is one or two or more selected from the group consisting of carbon disulfide, dimethyl sulfoxide, and ethanethiol.

In another exemplary embodiment, the alcohol-based non-solvent is one or two or more selected from the group consisting of methanol, ethanol, allyl alcohol, 1-propanol, 2-propanol, 1-butanol, 2-butanol, isobutanol, benzyl alcohol, cyclohexanol, diacetonealcohol, ethylene glycol monoethyl ether, diethylene glycol monomethyl ether, diethylene glycol monoethyl ether, ethylene glycol monobutyl ether, diethylene glycol monobutyl ether, 2-methoxyethanol and 1-decanol.

In the case where the alcohol-based non-solvent is used, a dipole is formed between the photoactive layer and the electrode to reduce a barrier of hole extraction, thus increasing a voltage density. Thus, it is possible to improve efficiency of the organic photovoltaic cell due to an increase in built-in potential and an increase in open voltage and Fill Factor (FF) by a decrease in surface energy trap.

Further, in the case where the non-solvent treating method is used by dissolving a water-soluble buffer material, metal nanoparticle and metal oxide or the like, treatment by the non-solvent and formation of the buffer layer may be formed simultaneously, and thus, there are merits in terms of time and cost of the process.

In the exemplary embodiment, the acid non-solvent is one or two or more selected from the group consisting of formic acid, acetic acid, benzoic acid, oleic acid, and stearic acid.

In the case where the acid non-solvent is used, the electron donating material is ionized to reduce a barrier of collection of interfacial charges, thus increasing a current density, or increasing wettability in the case where a water-soluble buffer material is subsequently applied, which is useful to coating.

In the exemplary embodiment, the phenol-based non-solvent is one or two or more selected from the group consisting of phenol, resorcinol, m-cresol, and methylsalicylate.

In the exemplary embodiment, the polyol-based non-solvent is one or two or more selected from the group consisting of ethylene glycol, glycerol, propylene glycol, diethylene glycol, triethylene glycol, and dipropylene glycol.

In the exemplary embodiment of the present specification, the non-solvent is a nitrogen compound non-solvent.

In the exemplary embodiment of the present specification, the non-solvent is acetonitrile.

In the exemplary embodiment of the present specification, the non-solvent is water.

In another exemplary embodiment, the non-solvent is an alkane-based non-solvent.

In another exemplary embodiment, the non-solvent is a halohydrocarbon-based non-solvent.

In the exemplary embodiment, the non-solvent is an ether-based non-solvent.

In another exemplary embodiment, the non-solvent is a ketone-based non-solvent.

In another exemplary embodiment, the non-solvent is an ester-based non-solvent.

In another exemplary embodiment, the non-solvent is a sulfur compound non-solvent.

In another exemplary embodiment, the non-solvent is an acid non-solvent.

In another exemplary embodiment, the non-solvent is an alcohol-based non-solvent.

In another exemplary embodiment, the non-solvent is a phenol-based non-solvent.

In another exemplary embodiment, the non-solvent is a polyol-based non-solvent.

In the exemplary embodiment, the non-solvent is one or two or more selected from the group consisting of alkanes, ethers, alcohols, and acids.

In the exemplary embodiment of the present specification, the temperature of heat treatment is a glass transition temperature (Tg) or more and a thermal decomposition temperature or less of the electron donating material.

In the case where the temperature of the heat treatment is less than the glass transition temperature of the electron donating material, a self organization phenomenon of the electron donating material may not occur well, and in the case where the temperature of the heat treatment is more than the thermal decomposition temperature of the electron donating material, the electron donating material may be broken to reduce an optical current generation characteristic.

The heat treatment provides a synergy effect to an effect caused by the non-solvent treating method to better arrange the molecular structure, thus increasing the conjugation length and the optical characteristic. Further, since a manufacturing process is relatively simple, there are temporal and economical advantages of the process.

In the exemplary embodiment of the present specification, the time of the heat treatment is 0 min to 5 hours. In another exemplary embodiment, the time of the heat treatment is 10 min to 3 hours. In another exemplary embodiment, the time of the heat treatment is 30 min to 45 min. The time may be adjusted according to the degree of self organization.

In the exemplary embodiment of the present specification, the electron accepting material is a fullerene derivative or a non-fullerene derivative.

In another exemplary embodiment, the fullerene derivative is a C60 to C90 fullerene derivative.

The fullerene derivatives as above may be unsubstituted or substituted by at least one additional substituent.

In the exemplary embodiment, the fullerene derivative is a C60 fullerene derivative or a C70 fullerene derivative.

In the exemplary embodiment, the C60 fullerene derivative or the C70 fullerene derivative is each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or may be further substituted by a substituent group obtained by forming a condensation cycle by two adjacent substituent groups.

In another exemplary embodiment, the fullerene derivative is selected from the group consisting of a C76 fullerene derivative, a C78 fullerene derivative, a C84 fullerene derivative, and a C90 fullerene derivative.

In the exemplary embodiment, the C76 fullerene derivative, the C78 fullerene derivative, the C84 fullerene derivative, and the C90 fullerene derivative are each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or may be further substituted by a substituent group obtained by forming a condensation cycle by two adjacent substituent groups.

The fullerene derivative has excellent separation ability of electron-hole pairs (exciton) and charge mobility as compared to a non-fullerene derivative, and thus, there is an advantage in terms of efficiency characteristic.

In another exemplary embodiment, the LUMO energy level of the non-fullerene derivative is −2.0 to −6.0 eV. In another exemplary embodiment, the LUMO energy level of the non-fullerene derivative is −2.5 to −5.0 eV. In another exemplary embodiment, the LUMO energy level of the non-fullerene derivative is −3.5 to −4.5 eV.

Electrons may be easily injected when the LUMO energy level is within the aforementioned range, thus increasing efficiency of the organic photovoltaic cell.

Particularly, in the case where the LUMO energy level of the non-fullerene derivative is −3.5 to −4.5 eV, charge separation can be performed while maximizing a difference with the HOMO energy level of the electron donating material, and thus, there is an advantage in that high open voltage and current density can be obtained.

Further, in the exemplary embodiment of the present specification, the non-fullerene derivative is a single molecule or a polymer having no spherical shape.

In the exemplary embodiment of the present specification, the electron donating material includes at least one kind of electron donor; or a polymer of at least one kind of electron acceptor and at least one kind of electron donor.

In the exemplary embodiment of the present specification, the electron donating material includes at least one kind of electron donor.

In another exemplary embodiment, the electron donating material includes a polymer of at least one kind of electron acceptor and at least one kind of electron donor.

In the exemplary embodiment of the present specification, the electron donor includes one or two or more from the group consisting of the following Chemical Formulas.

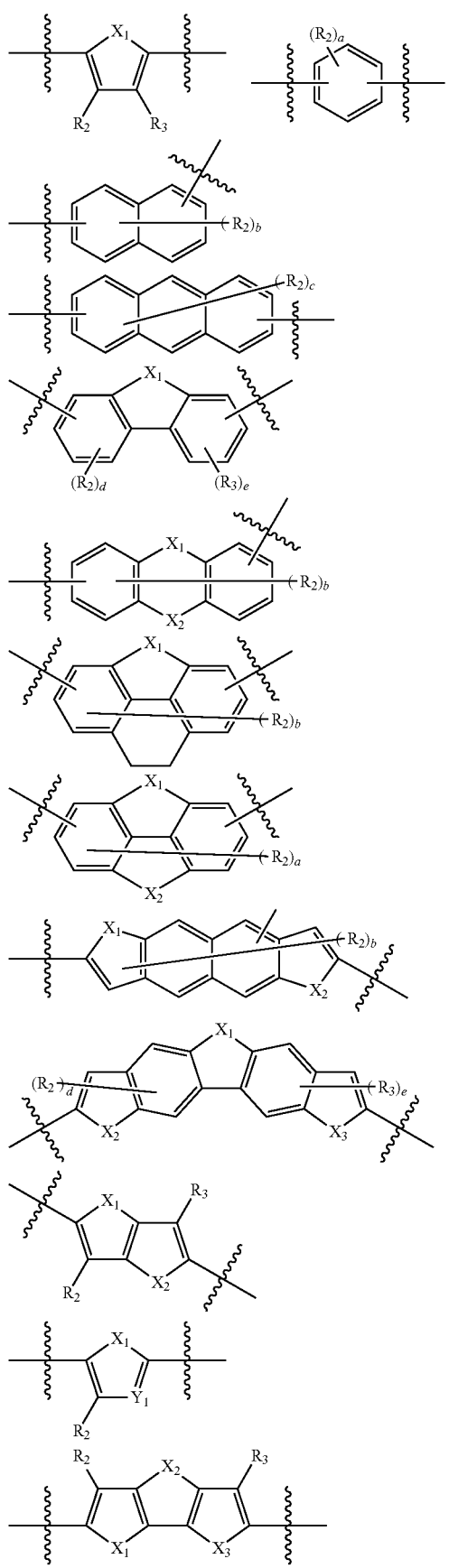
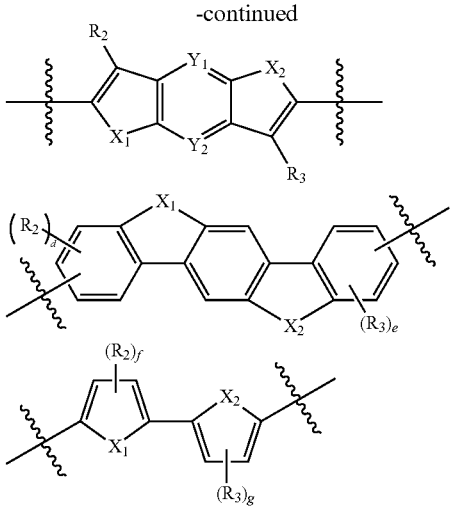

In the Chemical Formulas,
a is an integer of 0 to 4,
b is an integer of 0 to 6,
c is an integer of 0 to 8,
d and e are each an integer of 0 to 3,
f and g are each an integer of 0 to 2,
$R_2$ and $R_3$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle, $X_1$ to $X_3$ are the same as or different from each other, and each independently selected from the group consisting of CRR', NR, O, SiRR', PR, S, GeRR', Se and Te, $Y_1$ and $Y_2$ are the same as or different from each other, and each independently selected from the group consisting of CR, N, SiR, P and GeR, R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle.

In another exemplary embodiment, the electron acceptor includes one or two or more from the group consisting of the following Chemical Formulas.

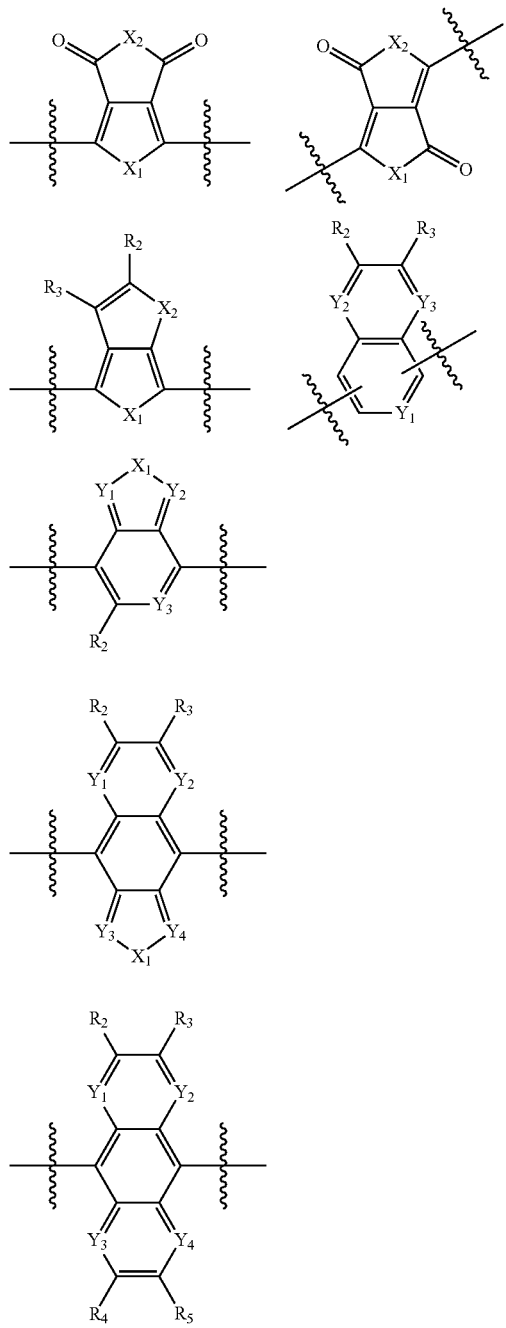

-continued

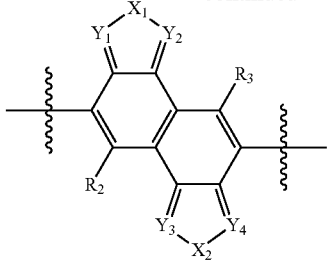

In the Chemical Formulas, $R_2$ to $R_5$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle, $X_1$ and $X_2$ are the same as or different from each other, and each independently selected from the group consisting of CRR', NR, O, SiRR', PR, S, GeRR', Se and Te, $Y_1$ to $Y_4$ are the same as or different from each other, and each independently selected from the group consisting of CR, N, SiR, P and GeR, R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle.

In another exemplary embodiment of the present specification, the electron donating material includes a polymer comprising an A unit represented by any one of the following formula 1, formula 2 and formula 3;
a B unit represented by the following formula 4; and
a C unit represented by the following formula 5:

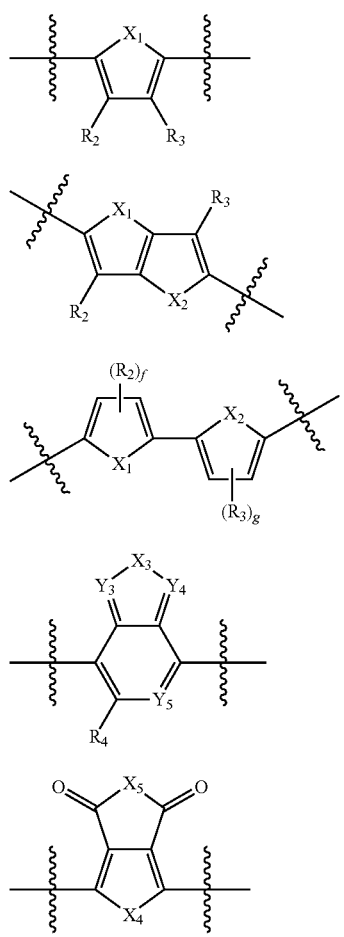

[formula 1]

[formula 2]

[formula 3]

[formula 4]

[formula 5]

wherein f and g are each an integer of 0 to 2, $R_2$ to $R_4$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle, $X_1$ and $X_5$ are the same as or different from each other, and each independently selected from the group consisting of CRR', NR, O, SiRR', PR, S, GeRR', Se and Te, $Y_3$ to $Y_5$ are the same as or different from each other, and each independently selected from the group consisting of CR, N, SiR, P and GeR, R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle.

In the exemplary embodiment of the present specification, the electron accepting material is the fullerene derivative. In another exemplary embodiment, the electron accepting material is a C60 fullerene derivative.

In the exemplary embodiment of the present specification, the electron accepting material is [6,6]-phenyl C-butyric acid methyl ester (PCBM).

In the exemplary embodiment of the present specification, the electron donating material is

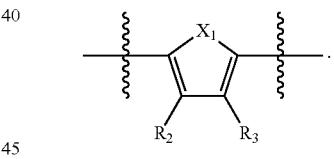

In this case, $X_1$ is S.

In another exemplary embodiment, the electron donating material is poly(3-hexylthiophene) (P3HT).

In another exemplary embodiment of the present specification, the electron donating material includes a copolymer comprising the A unit, the B unit and the C unit.

In another exemplary embodiment of the present specification, the A unit is formula 1.

In another exemplary embodiment of the present specification, the A unit is formula 1, $X_1$ is S, and $R_2$ and $R_3$ are hydrogen.

In another exemplary embodiment of the present specification, $X_3$ is S, $Y_3$ and $Y_4$ are N, $Y_5$ is CR.

In another exemplary embodiment of the present specification, R and $R_4$ are the same or different and are each independently a substituted or unsubstituted alkoxy group.

In another exemplary embodiment of the present specification, R and $R_4$ are the same or different and are each independently an alkoxy group.

In another exemplary embodiment of the present specification, R and $R_4$ are an octoxy group.

In another exemplary embodiment of the present specification, $X_5$ is NR.

In another exemplary embodiment of the present specification, $X_5$ is NR, R is a dodecanyl group.

In another exemplary embodiment of the present specification, $X_4$ is S.

In one embodiment of the present disclosure, the end group of the copolymer is a s substituted or unsubstituted heterocyclic group or a substituted or unsubstituted aryl group.

In another embodiment of the present disclosure, the end group of the copolymer is 4-(trifluoromethyl)phenyl.

In one embodiment of the present disclosure, the electron donating material is represented by the following polymer 1:

[Polymer 1]

In another exemplary embodiment of the present specification, the electron donating material includes a unit represented by the following formula 6:

[Formula 6]

Wherein
x is a mole fraction and a real number in the range of 0<x<1;
y is a mole fraction and a real number in the range of 0<y<1;
x+y=1;
n is an integer ranging from 1 to 10,000;
R10 to R12 are the same or different and are each independently selected from the group consisting of hydrogen; a substituted or unsubstituted alkyl group; or a substituted or unsubstituted alkoxy group.

In another exemplary embodiment of the present specification, R10 is a substituted or unsubstituted alkoxy group.

In another exemplary embodiment of the present specification, R10 is an octoxy group.

In another exemplary embodiment of the present specification, R11 is a substituted or unsubstituted alkoxy group.

In another exemplary embodiment of the present specification, R11 is an octoxy group.

In another exemplary embodiment of the present specification, R12 is a substituted or unsubstituted alkly group.

In another exemplary embodiment of the present specification, R12 is a dodecanyl group.

In another exemplary embodiment of the present specification, x is 0.5.

In another exemplary embodiment of the present specification, y is 0.5.

In the exemplary embodiment, the electron accepting material is [6,6]-phenyl C-butyric acid methyl ester (PCBM), and the electron donating material is poly(3-hexylthiophene) (P3HT).

In another exemplary embodiment, the electron accepting material is [6,6]-phenyl C-butyric acid methyl ester (PCBM), and the electron donating material is the above Polymer 1.

In another exemplary embodiment, the non-solvent is acetonitrile, the electron accepting material is [6,6]-phenyl C-butyric acid methyl ester (PCBM), and the electron donating material is poly(3-hexylthiophene) (P3HT).

In another exemplary embodiment, the non-solvent is acetonitrile, the electron accepting material is [6,6]-phenyl C-butyric acid methyl ester (PCBM), the electron donating material is poly(3-hexylthiophene) (P3HT), and a temperature of the heat treatment is a glass transition temperature or more and a thermal decomposition temperature or less of the electron donating material.

In another exemplary embodiment, the non-solvent is methanol, the electron accepting material is [6,6]-phenyl C-butyric acid methyl ester (PCBM), and the electron donating material is the above Polymer 1.

In another exemplary embodiment, the non-solvent is methanol, the electron accepting material is [6,6]-phenyl C-butyric acid methyl ester (PCBM), and the electron donating material is the above Polymer 1, and a temperature of the heat treatment is a glass transition temperature or more and a thermal decomposition temperature or less of the electron donating material.

In another exemplary embodiment, the non-solvent is 2-methoxyethanol, the electron accepting material is [6,6]-phenyl C-butyric acid methyl ester (PCBM), and the electron donating material is the above Polymer 1.

In another exemplary embodiment, the non-solvent is 2-methoxyethanol, the electron accepting material is [6,6]-phenyl C-butyric acid methyl ester (PCBM), and the electron donating material is the above Polymer 1, and a temperature of the heat treatment is a glass transition temperature or more and a thermal decomposition temperature or less of the electron donating material.

In the present specification, the photoactive layer includes the electron accepting material and the electron donating material.

Further, the electron accepting material and the electron donating material of the photoactive layer may form a bulk heterojunction (BHJ). In the exemplary embodiment of the present specification, the electron accepting material and the electron donating material are mixed with each other at a ratio (w/w) of 1:10 to 10:1. In another exemplary embodiment, the materials are mixed with each other at a weight ratio of 1:7 to 2:1. In another exemplary embodiment, the electron accepting material and the electron donating material are mixed with each other at a weight ratio of 1:4 to 5:3. In another exemplary embodiment, the electron accepting material and the electron donating material are mixed with each other at a weight ratio of 1:0.4 to 1:4.

If the electron accepting material is mixed in the amount of less than 0.4 weight ratio, the content of the crystallized electron accepting material is low to cause hindrance in movement of the generated electrons, and if the amount is more than 10 weight ratio, the amount of the electron donating material absorbing light is relatively reduced, causing a problem in that light is not efficiently absorbed.

In another exemplary embodiment, there is provided an organic photovoltaic cell in which a ratio ($I_{c=c}/I_{c-c}$) of an antisymmetric value and a symmetric value of an absorption spectrum of FT-IR is increased by 110 to 150% as compared to an intrinsic value of the electron accepting material and the electron donating material.

In another exemplary embodiment, there is provided an organic photovoltaic cell in which efficiency of the organic photovoltaic cell is increased by 110 to 200% as compared to the case where the photoactive layer includes the electron accepting material and the electron donating material before being treated by the non-solvent.

In another exemplary embodiment, the electron accepting material and the electron donating material are heat treated before, during, or after being treated by the non-solvent. In this case, there is provided an organic photovoltaic cell in which efficiency of the organic photovoltaic cell is increased by 110 to 150% as compared to the case where the photoactive layer includes the electron accepting material and the electron donating material before being treated by the non-solvent and heat treated.

FIG. 1 is a view illustrating a method of manufacturing a photoactive layer according to an exemplary embodiment of the present specification.

Figure 2:
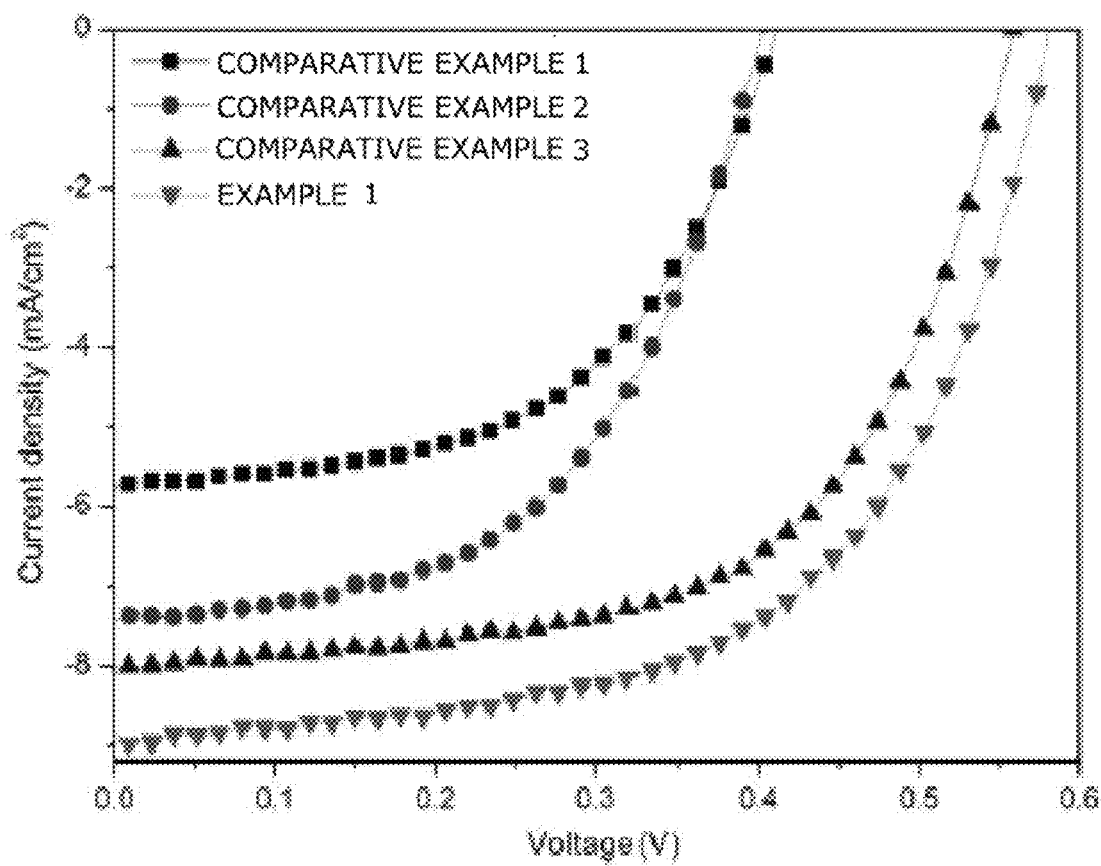
FIG. 2 is a view illustrating a J-V curve of Example 1 and Comparative Examples 1 to 3.

FIG. 2 is a view illustrating a J-V curve of Example 1 and Comparative Examples 1 to 3. Referring to FIG. 2, it can be seen that in the case where both the non-solvent swelling method and the heat treatment are performed, efficiency of the organic photovoltaic cell is increased as compared to the case where only the non-solvent swelling method or only the heat treatment is performed.

Figure 3:
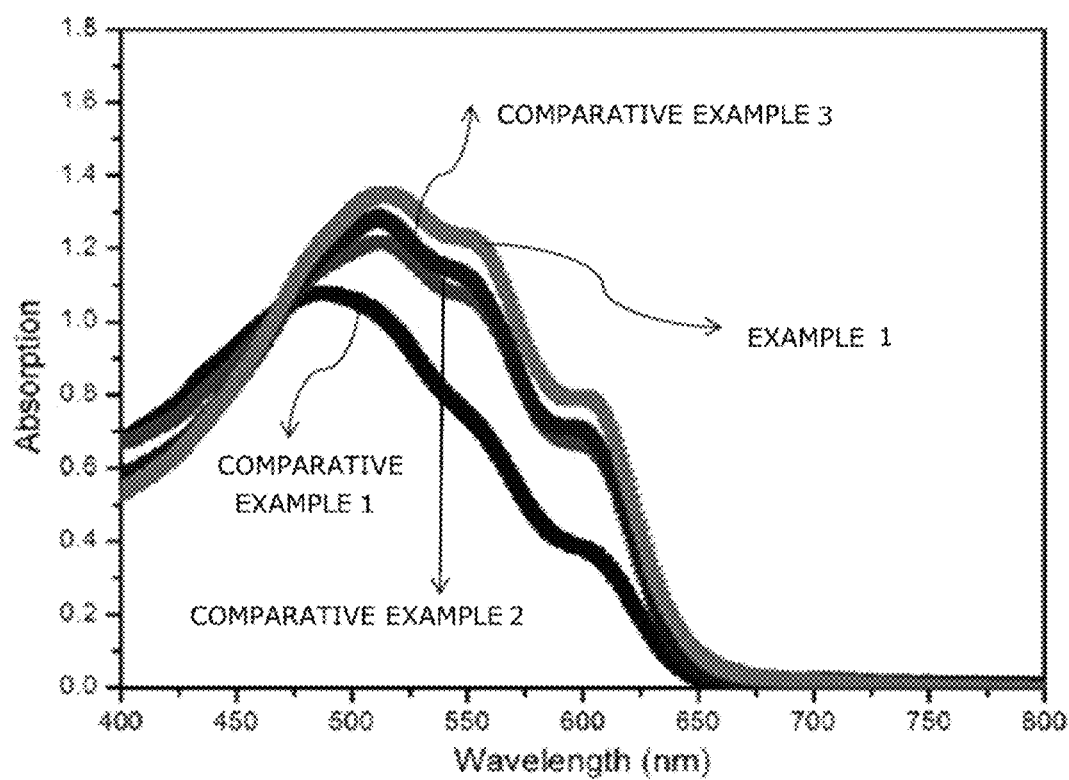
FIG. 3 is a view illustrating an absorption spectrum of Example 1 and Comparative Examples 1 to 3.

FIG. 3 is a view illustrating an absorption spectrum of Example 1 and Comparative Examples 1 to 3. As illustrated in FIG. 3, it can be seen that in the case where both the non-solvent swelling method and the heat treatment are performed, high light absorptivity is provided as compared to the case where only the non-solvent swelling method or only the heat treatment is performed. This is an effect according to an increase in conjugation length.

Figure 4:
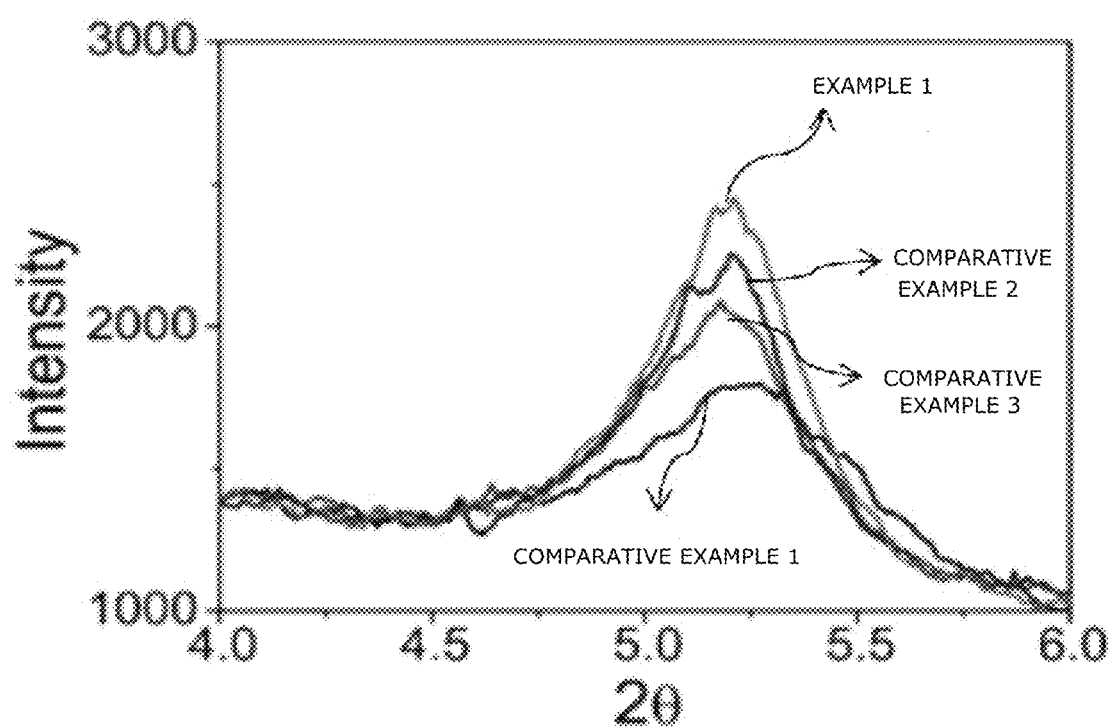
FIG. 4 is a graph illustrating an X-ray diffraction of Example 1 and Comparative Examples 1 to 3.

FIG. 4 is a graph illustrating an X-ray diffraction of Example 1 and Comparative Examples 1 to 3. As illustrated in FIG. 4, it can be seen that in the case where both the non-solvent swelling method and the heat treatment are performed, morphology and crystallinity of the photoactive layer are improved.

Figure 5:
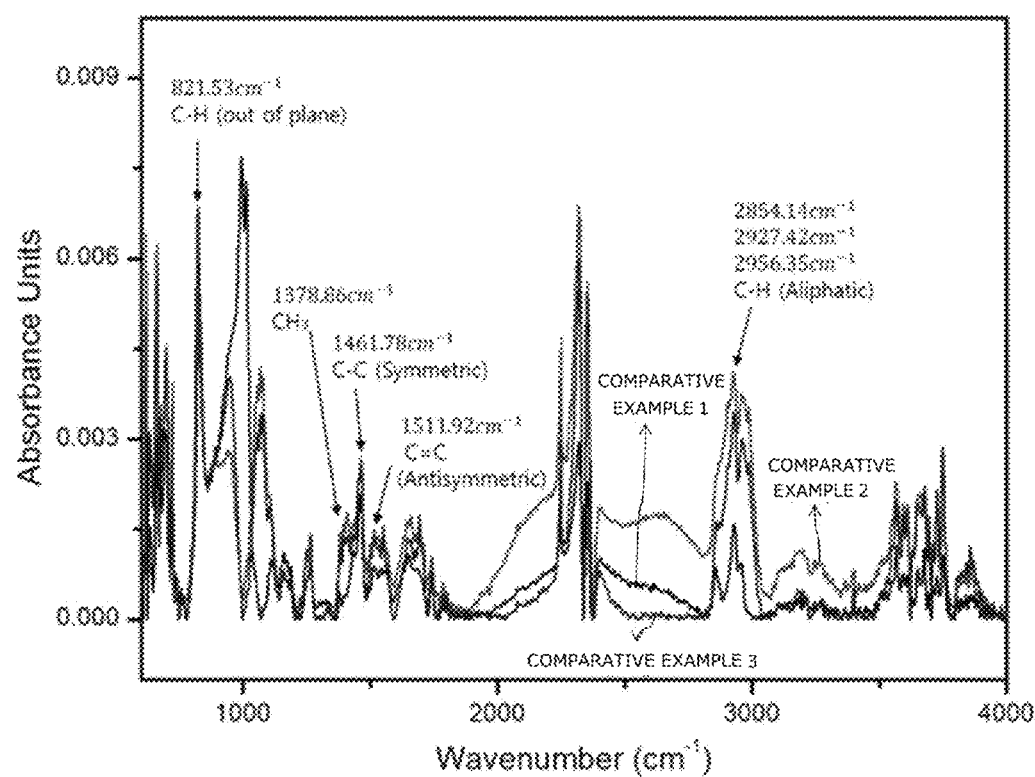
FIG. 5 is a graph illustrating an absorption spectrum of FT-IR of Comparative Examples 1 to 3.

FIG. 5 is a graph illustrating an absorption spectrum of FT-IR of Comparative Examples 1 to 3. In FIG. 5, it can be seen that in the case where the non-solvent swelling method or the heat treatment is performed, the conjugation length is increased.

Figure 6:
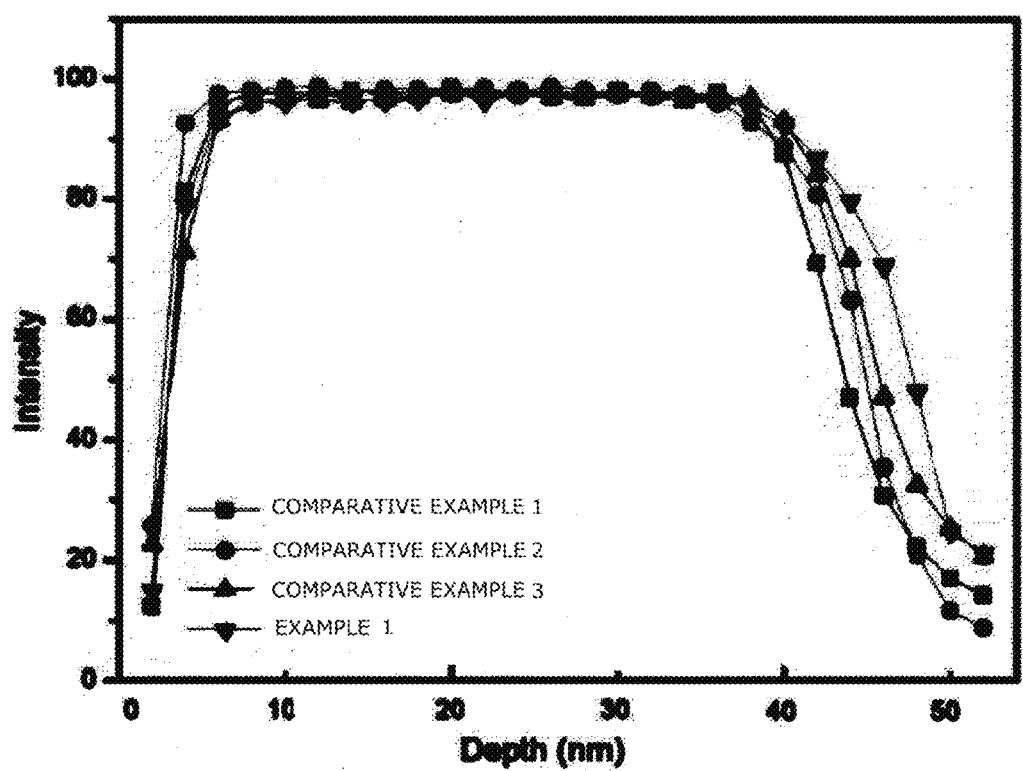
FIG. 6 is a graph illustrating an Auger electron spectroscopy of Example 1 and Comparative Examples 1 to 3.

FIG. 6 is a graph illustrating an Auger electron spectroscopy of Example 1 and Comparative Examples 1 to 3. As illustrated in FIG. 6, it can be seen that in the case where both the non-solvent swelling method and the heat treatment are performed, the permeation distance of the electrode into the photoactive layer is increased. In this case, an interfacial area between the photoactive layer and the electrode is increased, and efficiency of the organic photovoltaic cell is increased.

Figure 7:
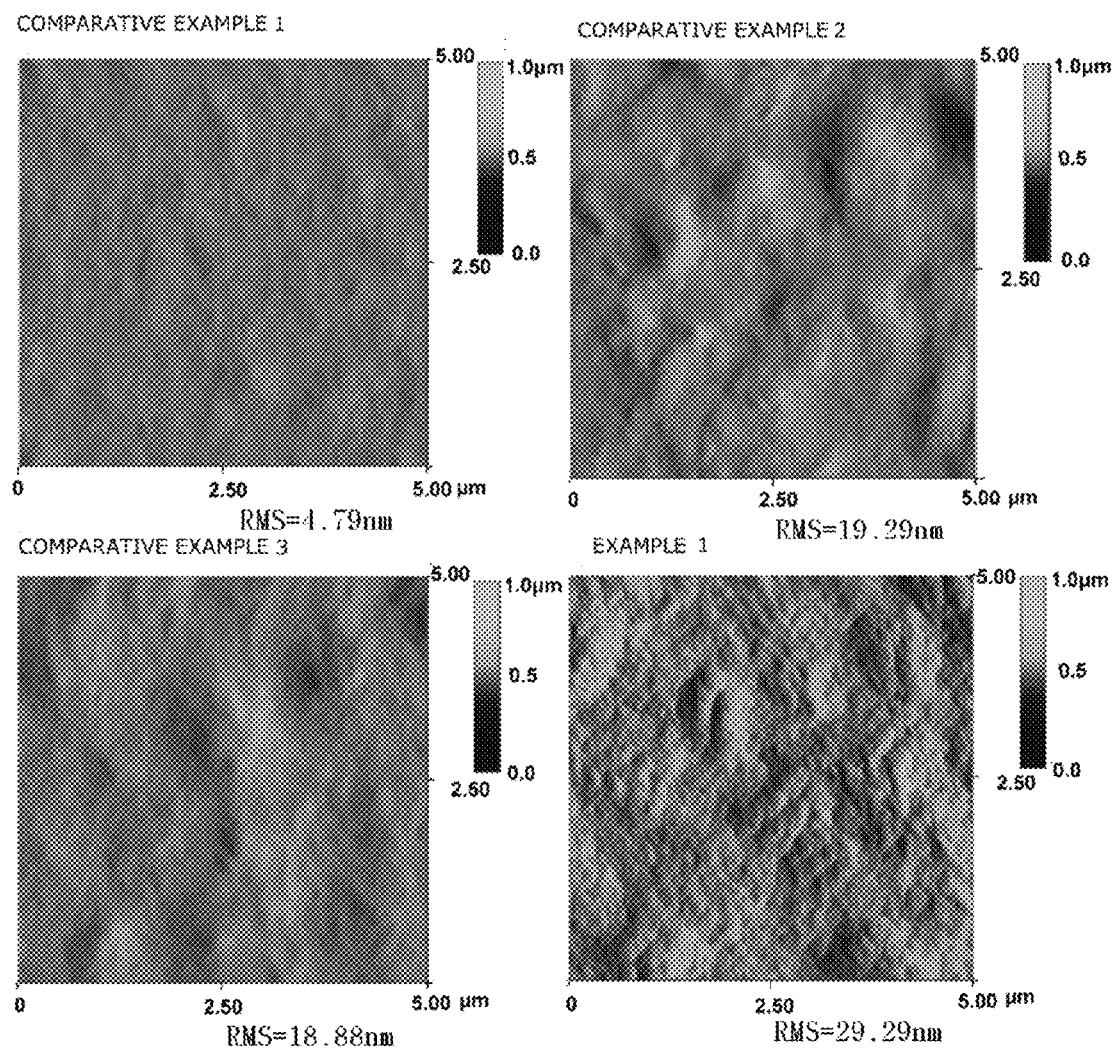
FIG. 7 is a view observed by an atomic force microscope (AFM) of Example 1 and Comparative Examples 1 to 3.

FIG. 7 is a view observed by an atomic force microscope (AFM) of Example 1 and Comparative Examples 1 to 3. As illustrated in FIG. 7, it can be seen that in the case where both the non-solvent swelling method and the heat treatment are performed, a root mean square (RMS) value of the surface of the photoactive layer is increased. If the root mean square value of the surface of the photoactive layer is increased, there are advantages in that a contact area between the photoactive layer and the electrode is increased and electron collection efficiency is increased.

Examples of the substituent groups will be described below, but are not limited thereto.

In the present specification, the alkyl group may be a straight or branched chain, and the number of carbon atoms is not particularly limited but is preferably 1 to 20. Specific examples thereof include a methyl group, an ethyl group, a propyl group, an isopropyl group, a butyl group, a t-butyl group, a pentyl group, a hexyl group, a heptyl group and the like, but are not limited thereto.

In the present specification, the alkenyl group may be a straight or branched chain, and the number of carbon atoms is not particularly limited but is preferably 2 to 40. Specific examples thereof preferably include an alkenyl group in which an aryl group such as a stylbenzyl group and a styrenyl group is substituted, but are not limited thereto.

In the present specification, the alkoxy group may be a straight, branched, or cycle chain. The number of carbon atoms of the alkoxy group is not particularly limited, but preferably 1 to 25. Specific examples thereof may include a methoxy group, an ethoxy group, a n-propyloxy group, an iso-propyloxy group, a n-butyloxy group, a cyclopentyloxy group and the like, but are not limited thereto.

In the present specification, the cycloalkyl group is not particularly limited, the number of carbon atoms thereof is preferably 3 to 60, and a cyclopentyl group and a cyclohexyl group are particularly preferable.

In the present specification, a halogen group may be fluorine, chlorine, bromine or iodine.

In the present specification, the aryl group may be a monocycle, and the number of carbon atoms thereof is not particularly limited but is preferably 6 to 60. Specific examples of the aryl group include monocyclic aromatics such as a phenyl group, a biphenyl group, a triphenyl group, a terphenyl group, and a stilbene group, polycyclic aromatics such as a naphthyl group, an anthracenyl group, a phenanthrenyl group, a pyrenyl group, a perylenyl group, a tetracenyl group, a crycenyl group, a fluorenyl group, an acenaphthacenyl group, a triphenylene group, and a fluoranthene group, and the like, but are not limited thereto.

In the present specification, the heterocyclic group is a heterocyclic group including O, N or S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a triazine group, an acridyl group, a pyridazine group, a quinolinyl group, an isoquinoline group, an indole group, a carbazole group, a benzoxazole group, a benzimidazole group, a benzthiazol group, a benzcarbazole group, a benzothiophene group, a dibenzothiophene group, a benzofuranyl group, a phenanthroline group, a dibenzofuranyl group, and the like, but are not limited thereto.

In the present specification, the number of carbon atoms of the imide group is not particularly limited but is preferably 1 to 25. Specifically, the imide group may be compounds having the following structures, but is not limited thereto.

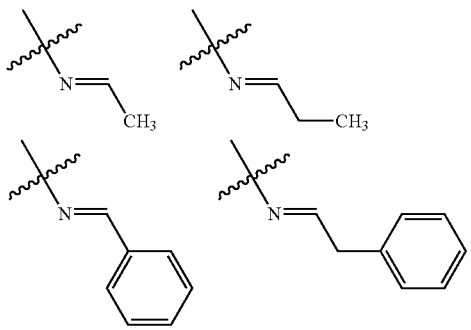

In the present specification, one or two nitrogen atoms of the amide group may be substituted by hydrogen, a straight-chained, branched-chained, or cyclic-chained alkyl group having 1 to 25 carbon atoms, or an aryl group having 6 to 25 carbon atoms. Specifically, the amide group may be compounds having the following Structural Formulas, but is not limited thereto.

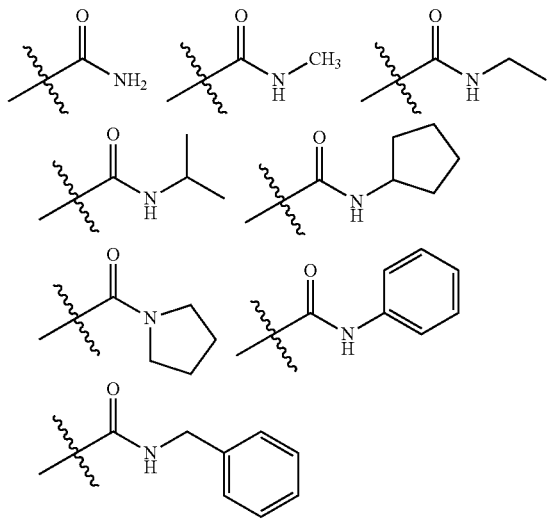

In the present specification, oxygen of the ester group may be substituted by a straight-chained, branched-chained, or cyclic-chained alkyl group having 1 to 25 carbon atoms, or an aryl group having 6 to 25 carbon atoms. Specifically, the ester group may be compounds having the following Structural Formulas, but is not limited thereto.

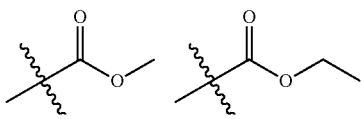

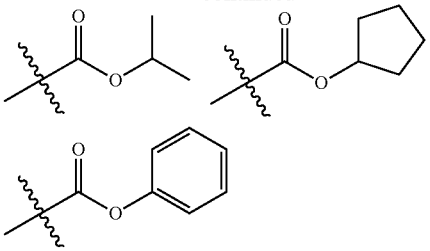

In the present specification, the heteroaryl group may be selected from the aforementioned examples of the heterocyclic group.

In the present specification, the fluorenyl group has a structure where two cyclic organic compounds are connected through one atom, and examples thereof include

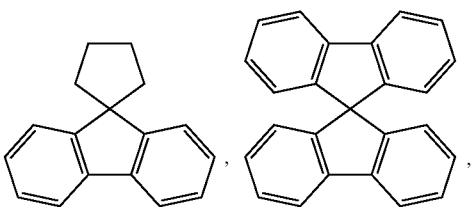

and the like.

In the present specification, the fluorenyl group includes a structure of an opened fluorenyl group, the opened fluorenyl group has a structure where two cyclic compounds are connected through one atom and connection of one cyclic compound is broken, and examples thereof include

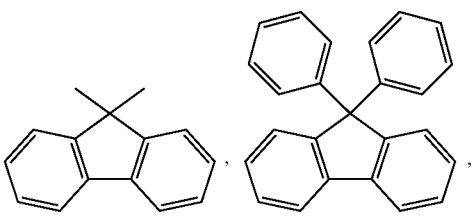

and the like.

In the present specification, the number of carbon atoms of the amine group is not particularly limited, but preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, examples of the arylamine group mean a substituted or unsubstituted monocyclic diarylamine group, a substituted or unsubstituted polycyclic diarylamine group or a substituted or unsubstituted monocyclic and polycyclic diarylamine group.

In the present specification, the aryl group of the aryloxy group, the arylthioxy group, the arylsulfoxy group, and the aralkylamine group is the same as the aforementioned examples of the aryl group.

In the present specification, the alkyl group of the alkylthioxy group, the alkylsulfoxy group, the alkylamine group, and the aralkylamine group is the same as the aforementioned examples of the alkyl group.

In the present specification, the heteroaryl group of the heteroarylamine group may be selected from the aforementioned examples of the heterocyclic group.

In the present specification, the arylene group, the alkenylene group, the fluorenylene group, the carbazolylene group, and the heteroarylene group are each a divalent group of the aryl group, the alkenyl group, the fluorenyl group, and the carbazole group. With the exception that the groups are each the divalent group, the aforementioned description of the aryl group, the alkenyl group, the fluorenyl group, and the carbazole group may be applied.

Further, in the present specification, the term "substituted or unsubstituted" means that substitution is performed by one or more substituent groups selected from the group consisting of deuterium; a halogen group; an alkyl group; an alkenyl group; an alkoxy group; a cycloalkyl group; a silyl group; an arylalkenyl group; an aryl group; an aryloxy group; an alkylthioxy group; an alkylsulfoxy group; an arylsulfoxy group; a boron group; an alkylamine group; an aralkylamine group; an arylamine group; a heteroaryl group; a carbazole group; an arylamine group; an aryl group; a fluorenyl group; a nitrile group; a nitro group; a hydroxy group, and a heterocyclic group including one or more of N, O, S atoms, or there is no substituent group.

In the exemplary embodiment of the present specification, the thickness of the photoactive layer is 50 to 300 nm. In another exemplary embodiment, the thickness of the photoactive layer is 100 to 250 nm. In another exemplary embodiment, the thickness of the photoactive layer is 150 to 230 nm.

In the case where the thickness of the photoactive layer is less than 50 nm, since a moving distance of charges is short, a fill factor value may be increased but light absorptivity is reduced, and in the case where the thickness is more than 300 nm, a current density is increased due to sufficient thickness of the photoactive layer, but there is a problem in that the fill factor value is low due to a long moving distance of generated carriers.

Accordingly, within the aforementioned range, there are advantages in that resistance between the interfaces of electrodes and the like and resistance in a bulk are not excessively large to increase the fill factor value, a current characteristic is excellent, and separation at the interface of the generated exciton and the moving length of the carriers are sufficient due to the sufficient thickness of the photoactive layer.

Further, the present specification provides an organic photovoltaic cell including: a first electrode; a second electrode facing the first electrode; and an organic layer provided between the first electrode and the second electrode and including a photoactive layer, in which the photoactive layer includes an electron accepting material and an electron donating material, and a ratio ($I_{c=c}/I_{c-c}$) of an antisymmetric value and a symmetric value of an absorption spectrum of FT-IR is increased by 110 to 150% as compared to an intrinsic value of the electron accepting material and the electron donating material.

The intrinsic value of the electron accepting material and the electron donating material means a ratio ($I_{c=c}/I_{c-c}$) of the antisymmetric value and the symmetric value of the absorption spectrum of FT-IR of the photoactive layer including the electron accepting material and the electron donating material that are not subjected to any treatment, for example, the heat treatment and/or the non-solvent treating method.

The ratio of the antisymmetric value and the symmetric value of FT-IR, that is, $I_{c=c}/I_{c-c}$ means an increase in conjugation length.

In the exemplary embodiment of the present specification, the ratio of the antisymmetric value and the symmetric value of the absorption spectrum of FT-IR is increased by 110 to 150%. In another exemplary embodiment, the ratio of the antisymmetric value and the symmetric value of the absorption spectrum of FT-IR is increased by 120 to 140%.

In the exemplary embodiment of the present specification, if the ratio of the antisymmetric value and the symmetric value of the absorption spectrum of FT-IR is within the aforementioned range, morphology and crystallinity of the organic photovoltaic cell are improved and increased, and thus, there is an advantage in that efficiency of the organic photovoltaic cell is increased.

In the exemplary embodiment of the specification, the electron accepting material and the electron donating material of the photoactive layer are treated by the non-solvent.

The electron accepting material and the electron donating material are heat treated before, during, or after being treated by the non-solvent.

The description of the electron accepting material, the electron donating material, and the photoactive layer of the organic photovoltaic cell in which the ratio ($I_{c=c}/I_{c-c}$) of the antisymmetric value and the symmetric value of the absorption spectrum of FT-IR is increased by 110 to 150% as compared to the intrinsic value of the electron accepting material and the electron donating material is the same as the aforementioned description.

There is provided an organic photovoltaic cell including: a first electrode; a second electrode facing the first electrode; and an organic layer provided between the first electrode and the second electrode and including a photoactive layer, in which the photoactive layer includes an electron accepting material and an electron donating material, the electron accepting material and the electron donating material are treated by a non-solvent, and efficiency of the organic photovoltaic cell is increased by 110 to 200% as compared to the case where the photoactive layer includes the electron accepting material and the electron donating material before being treated by the non-solvent.

The electron accepting material and the electron donating material are heat treated before, during, or after being treated by the non-solvent.

The description of the electron accepting material, the electron donating material, the photoactive layer, the non-solvent, and the heat treatment of the organic photovoltaic cell in which efficiency of the organic photovoltaic cell is increased by 110 to 200% as compared to the case where the photoactive layer includes the electron accepting material and the electron donating material before being treated by the non-solvent is the same as the aforementioned description.

In the exemplary embodiment of the present specification, there is provided the photoactive layer including the electron accepting material and the electron donating material treated by the non-solvent.

The electron accepting material and the electron donating material are heat treated before, during, or after being treated by the non-solvent.

The description of the electron accepting material, the electron donating material, the non-solvent, and the heat treatment of the photoactive layer is the same as the aforementioned description.

Further, the present specification provides the photoactive layer including the electron accepting material and the electron donating material, in which the ratio ($I_{c=c}/I_{c-c}$) of the antisymmetric value and the symmetric value of the absorption spectrum of FT-IR is increased by 110 to 150% as compared to the intrinsic value of the electron accepting material and the electron donating material.

The electron accepting material and the electron donating material of the photoactive layer are treated by the non-solvent.

Further, the electron accepting material and the electron donating material of the photoactive layer are heat treated before, during, or after being treated by the non-solvent.

Further, the description of the electron accepting material, the electron donating material, the non-solvent, and the heat treatment of the photoactive layer is the same as the aforementioned description.

In the exemplary embodiment of the present specification, the maximum absorption wavelength of the photoactive layer is 500 to 600 nm.

Further, in the exemplary embodiment of the present specification, the organic photovoltaic cell includes a first electrode, a photoactive layer, and a second electrode.

In another exemplary embodiment, the organic photovoltaic cell may further include a substrate, a hole transport layer, and/or an electron transport layer.

Further, in the exemplary embodiment of the present specification, a buffer layer may be further introduced between the photoactive layer and the first electrode.

In another exemplary embodiment, an electron transport layer, a hole blocking layer, or an optical space layer is further introduced between the photoactive layer and the second electrode.

In the exemplary embodiment of the present specification, the first electrode may be an anode electrode or a cathode electrode. Further, the second electrode may be the cathode electrode or the anode electrode.

In the exemplary embodiment of the present specification, in the organic photovoltaic cell, the anode electrode, the photoactive layer, and the cathode electrode may be disposed in this order, or the cathode electrode, the photoactive layer, and the anode electrode may be disposed in this order, but the order is not limited thereto.

In another exemplary embodiment, in the organic photovoltaic cell, the anode electrode, the hole transport layer, the photoactive layer, the electron transport layer, and the cathode electrode may be disposed in this order, or the cathode electrode, the electron transport layer, the photoactive layer, the hole transport layer, and the anode electrode may be disposed in this order, but the order is not limited thereto.

In another exemplary embodiment, in the organic photovoltaic cell, the anode electrode, the buffer layer, the photoactive layer, and the cathode electrode may be disposed in this order.

In the present specification, the buffer layer serves to reduce an energy band gap difference between the interfaces, thus increasing efficiency of the organic photovoltaic cell.

The buffer layer is selected from the group consisting of PEDOT:PSS, molybdenum oxide ($MoO_3$), tungsten oxide ($WO_3$), and zinc oxide (ZnO).

In the exemplary embodiment, the thickness of the buffer layer is 1 to 60 nm. In another exemplary embodiment, the thickness of the buffer layer is 10 to 50 nm. In another exemplary embodiment, the thickness of the buffer layer is 30 to 45 nm.

Within the aforementioned range, there are advantages in that the buffer layer improves light transmission, reduces series resistance of the photovoltaic cell, and improves an interfacial property of another layer to manufacture the photovoltaic cell having high efficiency.

The substrate may be a glass substrate or a transparent plastic substrate having excellent transparency, surface flatness, easiness in handling, and water resistance, but is not limited thereto, and there is no limitation as long as the substrate is a substrate generally used in the organic photovoltaic cell. Specific examples thereof include glass, PET (polyethylene terephthalate), PEN (polyethylene naphthalate), PP (polypropylene), PI (polyimide), TAC (triacetyl cellulose), or the like, but are not limited thereto.

The first electrode may be of a material having transparency and excellent conductivity, but is not limited thereto. Specific examples thereof include metal such as vanadium, chrome, copper, zinc, and gold, or an alloy thereof; metal oxides such as zinc oxides, indium oxides, indium tin oxides (ITO), and indium zinc oxides (IZO); a combination of metal and oxides, such as $ZnO:Al$ or $SnO_2:Sb$; conductive polymers such as poly(3-methylthiophene), poly[3,4-(ethylene-1,2-dioxy)thiophene] (PEDOT), polypyrrole and polyaniline, and the like, but are not limited thereto.

The second electrode may be of metal having a small work function, but is not limited thereto. Specific examples thereof include metal such as magnesium, calcium, sodium, potassium, titanium, indium, yttrium, lithium, gadolinium, aluminum, silver, tin, and lead, or an alloy thereof; and material having a multilayered structure, such as LiF/Al, $LiO_2/Al$, LiF/Fe, Al:Li, $Al:BaF_2$, and $Al:BaF_2:Ba$, but are not limited thereto.

The hole transport layer and/or the electron transport layer materials may be a material efficiently transporting electrons and holes to the photoactive layer to increase a possibility of movement of generated charges to the electrode, but are not particularly limited thereto.

The hole transport layer material may be PEDOT:PSS (poly(3,4-ethylenediocythiophene) doped with poly(styrenesulfonic acid)), or N,N'-bis(3-methylphenyl)-N,N'-diphenyl-[1,1'-biphenyl]-4,4'-diamine (TPD). The electron transport layer material may be aluminum trihydroxyquinoline ($Alq_3$), PBD (2-(4-biphenyl)-5-phenyl-1,3,4-oxadiazole) that is a 1,3,4-oxadiazole derivative, TPQ (1,3,4-tris[(3-phenyl-6-trifluoromethyl)quinoxaline-2-yl]benzene) that is a quinoxaline derivative, a triazole derivative, or the like.

The electron transport material is a material that is capable of accepting well the electrons from the cathode and transports the electrons to the photoactive layer, and a material having large mobility to the electron is appropriate. Specific examples thereof include a 8-hydroxyquinoline Al complex; a complex including $Alq_3$; an organic radical compound; a hydroxyflavone-metal complex, and the like, but are not limited thereto.

The hole injection material is a material that is capable of accepting well holes from the anode at a low voltage, and it is preferable that a HOMO (highest occupied molecular orbital) of the hole injection material be a value between a work function of the anode material and the HOMO of an organic layer therearound. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline, a polythiophene-based conductive polymer, and the like, but are not limited thereto.

The organic photovoltaic cell of the present specification may be manufactured by a material and a method known in the art, except that the photoactive layer is treated by the non-solvent or is treated by the non-solvent with heat treatment.

The present specification provides a method of manufacturing an organic photovoltaic cell, including: preparing a substrate; forming a first electrode in one region of the substrate; forming an organic layer including a photoactive layer on an upper portion of the first electrode; performing surface treatment of the photoactive layer by a non-solvent; and forming a second electrode on the organic layer.

In the present specification, performing surface treatment of a photoactive layer by a non-solvent comprises applying the non-solvent.

In one exemplary embodiment of the present specification, performing surface treatment of the photoactive layer by a non-solvent further comprise removing the applied non-solvent.

In the removing of the non-solvent, if necessary, the duration after applying the non-solvent may be controlled to do swelling treatment by a non-solvent or surface treatment by a non-solvent.

The method further includes performing heat treatment before, during, or after the photoactive layer is subjected to surface treatment by the non-solvent.

The organic photovoltaic cell of the present specification may be manufactured, for example, by sequentially laminating a first electrode, an organic layer including a photoactive layer, and a second electrode on a substrate. In this case, coating may be performed by wet methods such as gravure printing, offset printing, screen printing, inkjet, spin coating, and spray coating, but is not limited to the methods.

In the exemplary embodiment, the photoactive layer includes the electron accepting material and the electron donating material.

The description of the electron accepting material, the electron donating material, the non-solvent, the photoactive layer, the non-solvent treating method, and the heat treatment is the same as the aforementioned description.

In another exemplary embodiment, the photoactive layer is formed from a mixing solution of poly(3-hexylthiophene) (P3HT) and [6,6]-phenyl C-butyric acid methyl ester (PCBM).

In another exemplary embodiment, the method further includes forming an organic layer after the performing of the heat treatment and before the forming of the second electrode.

The organic layer is a hole transport layer, a hole injection layer, an electron transport layer, an electron injection layer, a buffer layer, or the like, but is not limited thereto.

In another exemplary embodiment, the method further includes forming an organic layer after the forming of the first electrode and before the forming of the photoactive layer.

In another exemplary embodiment, the method further includes forming a buffer layer after the forming of the first electrode and before the forming of the photoactive layer.

In another exemplary embodiment, a step of performing the surface treatment of the photoactive layer by the non-solvent is spin coating or drop coating.

MODE FOR INVENTION

Manufacturing of the organic photovoltaic cell including the photoactive layer that is subjected to the non-solvent treating method and the heat treatment will be described in detail in the following Examples. However, the following Examples are set forth to illustrate the present specification, but the scope of the present specification is not limited thereto.

Manufacturing and Characteristic Measurement of the Organic Photovoltaic Cell

Example 1

Manufacturing of the Organic Photovoltaic Cell that was Subjected to the Non-Solvent Swelling Method And the Heat Treatment The organic photovoltaic cell had the structure of ITO/PEDOT:PSS/photoactive layer (P3HT:PCBM)/Al. The glass substrate on which the ITO was applied was washed by an ultrasonic wave by using distilled water, acetone, or 2-propanol, the ITO surface was treated by ozone for 10 min, spin coating was performed by using PEDOT:PSS (Clavios P) in a thickness of 40 nm, and heat treatment was performed at 200° C. for 5 min. The mixture of P3HT:PCBM mixed at a ratio of 1:0.6 is formed for coating of the photoactive layer, and the spin coating was performed in a thickness of 220 nm to form the photoactive layer. 80 µl of acetonitrile was applied at an interval of 10 min on the photoactive layer, and subjected to the spin coating at 5000 rpm and the non-solvent swelling method. Al was deposited in a thickness of 150 nm by using the thermal evaporator under the vacuum of $3\times10^{-6}$ torr. Further, heat treatment was performed at 150° C. for 30 min.

Comparative Example 1

The same procedure as Example 1 was performed, except that the non-solvent swelling method and the heat treatment were not applied unlike Example 1.

Comparative Example 2

The same procedure as Example 1 was performed, except that the heat treatment was not applied unlike Example 1.

Comparative Example 3

The same procedure as Example 1 was performed, except that the non-solvent swelling method was not applied unlike Example 1.

The photoelectric transformation characteristic of the organic photovoltaic cell manufactured in Example 1 and Comparative Examples 1 to 3 was measured under the condition of 100 mW/cm² (AM 1.5), and the result is described in the following Table 1.

TABLE 1

| Classification | Characteristics 1 of the organic photovoltaic cell | | | |
|---|---|---|---|---|
| | Open voltage (Voc) | Density of short-circuit current (Jsc) | Fill factor | Energy conversion efficiency (%) |
| Example 1 | 0.58 | 8.96 | 0.58 | 3.01 |
| Comparative Example 1 | 0.41 | 5.74 | 0.54 | 1.28 |
| Comparative Example 2 | 0.40 | 7.42 | 0.53 | 1.58 |
| Comparative Example 3 | 0.56 | 8.01 | 0.59 | 2.64 |

FIG. 2 is a graph illustrating a current-voltage curve of the organic photovoltaic cell.

Like the result of Table 1, it can be seen that in Example 1 adopting both the non-solvent swelling method and the heat treatment, efficiency is improved as compared to Comparative Examples 1 to 3 not adopting both the non-solvent swelling method and the heat treatment or adopting any one only either methods.

Like the result of Table 1, it can be seen that the non-solvent swelling method and the heat treatment affect a short-circuit current density and a fill factor, and affect energy conversion efficiency.

Example 2

Manufacturing of the Organic Photovoltaic Cell that was Subjected to the Non-Solvent Surface Treating Method The organic photovoltaic cell had the structure of ITO/PEDOT:PSS/photoactive layer (the following polymer 1:PCBM)/Al. The glass substrate on which the ITO was applied was washed by an ultrasonic wave by using distilled water, acetone, 2-propanol, the ITO surface was treated by ozone for 10 min, then spin coating was performed by using PEDOT:PSS (Clavios AI4083) in a thickness of 26 nm, and heat treatment was performed at 200° C. for 5 min. The mixture of the following polymer 1:PCBM mixed at a ratio of 1:1.75 is formed for coating of a photoactive layer, and the spin coating was performed in a thickness of 100 nm to form a photoactive layer. Methanol was applied on the photoactive layer, and subjected to the spin coating for the non-solvent surface treating method to remove the non-solvent at 5000 rpm. Al was deposited in a thickness of 150 nm by using a thermal evaporator under the vacuum of $3\times10^{-6}$ torr.

Example 3

Manufacturing of the Organic Photovoltaic Cell that was Subjected to the Non-Solvent Surface Treating Method The same procedure as Example 2 was performed, except that the 2-methoxyethanol was used instead of Methanol.

Comparative Example 4

The same procedure as Example 2 was performed, except that the non-solvent treating method was not performed.

The photoelectric transformation characteristic of the organic photovoltaic cell manufactured in Example 2, Example 3 and Comparative Example 4 was measured under the condition of 100 mW/cm² (AM 1.5), and the result was described in the following Table 2.

TABLE 2

| | $V_{oc}$ (V) | $J_{sc}$ (mA/cm²) | FF | PCE (%) |
|---|---|---|---|---|
| Example 2 | 0.830 | 13.227 | 0.560 | 6.14 |
| Example 3 | 0.835 | 12.820 | 0.595 | 6.37 |
| Comparative Example 4 | 0.763 | 13.383 | 0.544 | 5.55 |

As shown in the result of Table 2, it can be seen that, when the photoactive layer was treated by the non-solvent, efficiency of organic photovoltaic cell is improved caused by increased built-in potential caused by dipole formation at the interface of the photoactive layer and increased Fill Factor and open voltage by decreasing surface energy trap.

The invention claimed is:

1. An organic photovoltaic cell comprising:
a first electrode;
a second electrode facing the first electrode; and
an organic layer provided between the first electrode and the second electrode and including a photoactive layer,
wherein the photoactive layer includes an electron accepting material and an electron donating material, and the electron accepting material and the electron donating material are treated by a non-solvent and
the electron donating material includes a polymer comprising:
an A unit represented any one of by the following formula 1, formula 2 and formula 3;

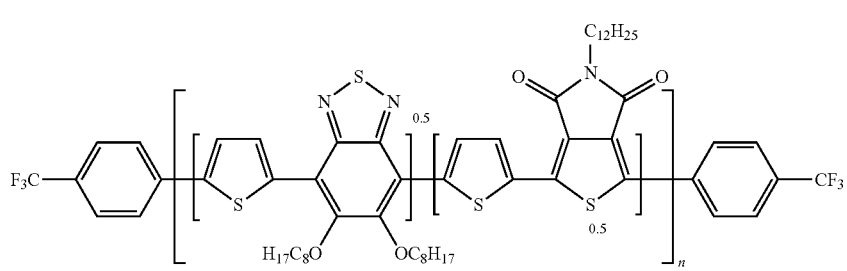

[Polymer 1]

a B unit represented by the following formula 4; and
a C unit represented by the following formula 5:

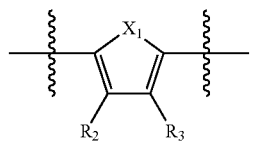

[formula 1]

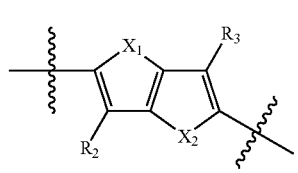

[formula 2]

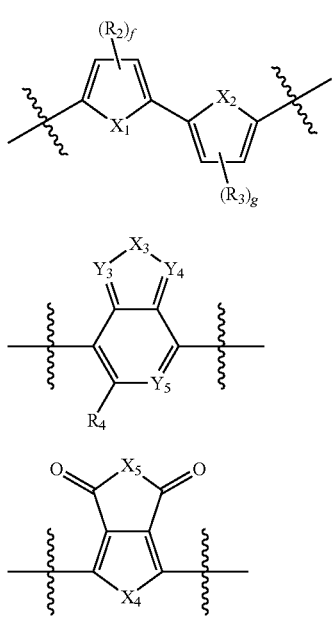

[formula 3]

[formula 4]

[formula 5]

wherein f and g are each an integer of 0 to 2,
wherein f and g are each an integer of 0 to 2,
R$_2$ to R$_4$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle,
X$_1$ and X$_5$ are the same as or different from each other, and each independently selected from the group consisting of CRR', NR, O, SiRR', PR, S, GeRR', Se and Te,
Y$_3$ to Y$_5$ are the same as or different from each other, and each independently selected from the group consisting of CR, N, SiR, P and GeR,
R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkyl-sulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle.

2. The organic photovoltaic cell of claim 1, wherein the electron accepting material and the electron donating material are heat treated before, during, or after being treated by the non-solvent.

3. The organic photovoltaic cell of claim 2, wherein a temperature of the heat treatment is a glass transition temperature (Tg) or more and a thermal decomposition temperature or less of the electron donating material.

4. The organic photovoltaic cell of claim 1, wherein when the non-solvent is applied on the photoactive layer for 1 min to 60 min, a permeation distance of the non-solvent into the photoactive layer is 5% or more and less than 50% of a thickness of the photoactive layer.

5. The organic photovoltaic cell of claim 1, wherein the non-solvent is one or two or more selected from the group consisting of water, alkanes, halohydrocarbons, ethers, ketones, esters, nitrogen compounds, sulfur compounds, acids, alcohols, phenols, and polyols.

6. The organic photovoltaic cell of claim 1, wherein the electron accepting material is a fullerene derivative or a non-fullerene derivative.

7. The organic photovoltaic cell of claim 1, wherein the non-solvent is a nitrogen compound non-solvent.

8. The organic photovoltaic cell of claim 1, wherein the non-solvent is acetonitrile.

9. The organic photovoltaic cell of claim 1, wherein the non-solvent is one or two or more selected from the group consisting of alkanes, ethers, alcohols, and acids.

10. The organic photovoltaic cell of claim 1, wherein the non-solvent is methanol or 2-methoxyethanol.

11. The organic photovoltaic cell of claim 1, wherein the electron accepting material is [6,6]-phenyl C-butyric acid methyl ester (PCBM), and the electron donating material is poly(3-hexylthiophene) (P3HT) or a polymer comprising a unit represented by the following formula 6:

[Formula 6]

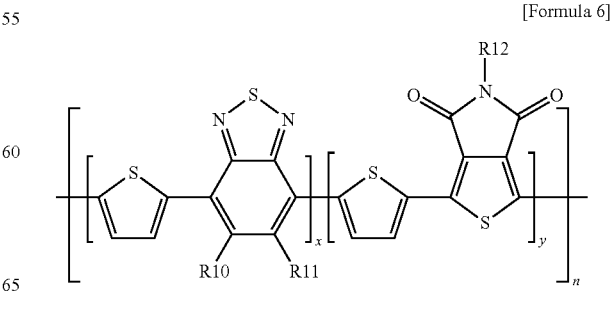

wherein x is a mole fraction and a real number in the range of 0<x<1;

y is a mole fraction and a real number in the range of 0<y<1;

x+y=1;

n is an integer ranging from 1 to 10,000;

R10 to R12 are the same or different and are each independently hydrogen; a substituted or unsubstituted alkyl group; or a substituted or unsubstituted alkoxy group.

12. The organic photovoltaic cell of claim 1, wherein a ratio ($I_{c=c}/I_{c-c}$) of an antisymmetric value and a symmetric value of an absorption spectrum of FT-IR is increased by 110 to 150% as compared to an intrinsic value of the electron accepting material and the electron donating material.

13. The organic photovoltaic cell of claim 1, wherein efficiency of the organic photovoltaic cell is increased by 110 to 200% as compared to the case where the photoactive layer includes the electron accepting material and the electron donating material before being treated by the non-solvent.

14. A photoactive layer comprising:

an electron accepting material, and an electron donating material, wherein the electron accepting material and the electron donating material are treated by a non-solvent and the electron donating material includes a polymer comprising an A unit represented any one of by the following formula 1, formula 2 and formula 3;

a B unit represented by the following formula 4; and a C unit represented by the following formula 5:

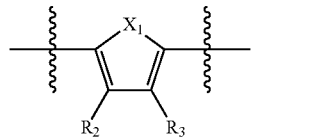
[formula 1]

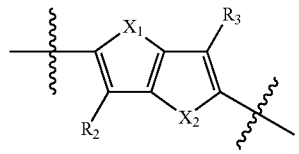
[formula 2]

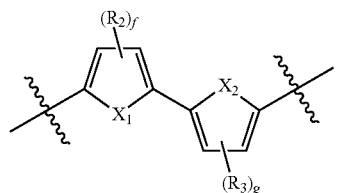
[formula 3]

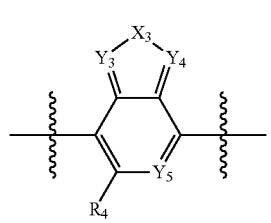
[fomrula 4]

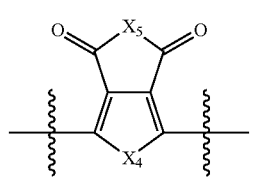
[formula 5]

wherein f and g are each an integer of 0 to 2, $R_2$ to $R_4$ are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle, $X_1$ and $X_5$ are the same as or different from each other, and each independently selected from the group consisting of CRR', NR, O, SiRR', PR, S, GeRR', Se and Te, $Y_3$ to $Y_5$ are the same as or different from each other, and each independently selected from the group consisting of CR, N, SiR, P and GeR, R and R' are the same as or different from each other, and each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; and a substituted or unsubstituted heterocyclic group including one or more of N, O and S atoms, or two adjacent substituent groups may bond together to form a condensation cycle.

15. The photoactive layer of claim 14, wherein the non-solvent is one or two or more selected from the group consisting of water, alkanes, halohydrocarbons, ethers, ketones, esters, nitrogen compounds, sulfur compounds, acids, alcohols, phenols, and polyols.

16. The photoactive layer of claim 14, wherein the electron accepting material and the electron donating material are heat treated before, during, or after being treated by the non-solvent.

* * * * *